(12) United States Patent
Song et al.

(10) Patent No.: US 11,489,029 B2
(45) Date of Patent: Nov. 1, 2022

(54) TRANSPARENT DISPLAY SUBSTRATE INCLUDING CAPACITOR OVERLAPPING DRIVING AND SWITCHING TFTS, AND MANUFACTURING METHOD THEREFOR

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 190 days.

(21) Appl. No.: 16/964,127

(22) PCT Filed: Dec. 20, 2019

(86) PCT No.: PCT/CN2019/126874
§ 371 (c)(1),
(2) Date: Jul. 22, 2020

(87) PCT Pub. No.: WO2020/140767
PCT Pub. Date: Jul. 9, 2020

(65) Prior Publication Data
US 2021/0036081 A1      Feb. 4, 2021

(30) Foreign Application Priority Data
Jan. 2, 2019     (CN) .......................... 201910002677.1

(51) Int. Cl.
*H01L 27/32*     (2006.01)
*H01L 51/52*     (2006.01)
*H01L 51/56*     (2006.01)

(52) U.S. Cl.
CPC ........ *H01L 27/3262* (2013.01); *H01L 27/322* (2013.01); *H01L 27/3265* (2013.01);
(Continued)

(58) Field of Classification Search
CPC .............. H01L 27/3262; H01L 27/322; H01L 27/3265; H01L 27/3276; H01L 27/326;
(Continued)

(56) References Cited

U.S. PATENT DOCUMENTS

2013/0235292 A1*  9/2013  Hara ................. G02F 1/136227
                                                    438/4
2016/0020266 A1   1/2016  Park et al.
(Continued)

FOREIGN PATENT DOCUMENTS

CN     101930994 A  * 12/2010
CN     101930994 A    12/2010
(Continued)

OTHER PUBLICATIONS

First Office Action for related CN App No. 201910002677.1 dated Jun. 2, 2020. English translation provided; 15 pages.

*Primary Examiner* — Matthew E. Gordon
(74) *Attorney, Agent, or Firm* — Procopio, Cory, Hargreaves & Savitch LLP (57) ABSTRACT

A transparent display substrate includes a first base and a plurality of sub-pixels disposed on the first base. At least one sub-pixel of the plurality of sub-pixels has a light-emitting region and a transparent region. In the at least one sub-pixel, each sub-pixel includes at least one thin-film transistor, a capacitor and a self-luminescent device that are located in the light-emitting region of the sub-pixel. The self-luminescent device is disposed on a side of the capacitor away from the at least one thin film transistor in a direction perpendicular to the first base. The at least one thin film transistor and the capacitor are electrically connected.

19 Claims, 6 Drawing Sheets

(52) U.S. Cl.
CPC ...... *H01L 27/3276* (2013.01); *H01L 51/5215* (2013.01); *H01L 51/5218* (2013.01); *H01L 51/5284* (2013.01); *H01L 51/56* (2013.01); *H01L 2227/323* (2013.01)

(58) Field of Classification Search
CPC ............. H01L 27/3248; H01L 27/3258; H01L 51/5215; H01L 51/5218; H01L 51/5284; H01L 51/56; H01L 2227/323
USPC .......................................................... 257/40
See application file for complete search history.

(56) References Cited

U.S. PATENT DOCUMENTS

| | | | | |
|---|---|---|---|---|
| 2016/0133681 | A1* | 5/2016 | Nam | .................... H01L 27/3258 257/40 |
| 2017/0084635 | A1* | 3/2017 | Jung | .................... H01L 27/1285 |
| 2017/0338252 | A1* | 11/2017 | Lee | ...................... H01L 27/1251 |

FOREIGN PATENT DOCUMENTS

| | | | | | |
|---|---|---|---|---|---|
| CN | 103229095 | A | | 7/2013 | |
| CN | 203674211 | U | | 6/2014 | |
| CN | 107403804 | A | * | 11/2017 | ......... H01L 27/1222 |
| CN | 107403804 | A | | 11/2017 | |
| CN | 108735792 | A | | 11/2018 | |
| CN | 109728000 | A | | 5/2019 | |

\* cited by examiner

FIG. 1

(Prior Art)

An active layer, a gate insulating layer, a gate metal layer, and a source-drain metal layer are formed on the first base. The active layer, the gate insulating layer, the gate metal layer and the source-drain metal layer form the at least one thin film transistor. The at least one thin film transistor includes a driving thin film transistor and a first switching thin film transistor. The driving thin film transistor includes a first gate, a first source and a first drain. The first switching thin film transistor includes a second gate, a second source and a second drain ─ S21

A first electrode layer is formed at a side of the source-drain metal layer away from the first base. The first electrode layer includes a first electrode of the capacitor that is electrically connected to the first gate and the second drain ─ S22

A first insulating layer is formed at a side of the first electrode layer away from the first base ─ S23

A second electrode layer is formed at a side of the first insulating layer away from the first base. The second electrode layer includes a second electrode of the capacitor that is electrically connected to the first source or the first drain ─ S24

TRANSPARENT DISPLAY SUBSTRATE INCLUDING CAPACITOR OVERLAPPING DRIVING AND SWITCHING TFTS, AND MANUFACTURING METHOD THEREFOR

CROSS-REFERENCE TO RELATED APPLICATIONS

This application is a national phase entry under 35 USC 371 of International Patent Application No. PCT/CN2019/126874 filed on Dec. 20, 2019, which claims priority to Chinese Patent Application No. 201910002677.1, filed on Jan. 2, 2019, which are incorporated herein by reference in their entirety.

TECHNICAL FIELD

The present disclosure relates to the field of display technologies, and in particular, to a transparent display substrate and method for manufacturing the same, and a transparent display panel.

BACKGROUND

With the development of information society, novel display technologies, such as transparent display devices, have a broad market prospect due to good user experience.

SUMMARY

In one aspect, a transparent display substrate is provided. The transparent display substrate includes a first base and a plurality of sub-pixels disposed on the first base. At least one sub-pixel of the plurality of sub-pixels has a light-emitting region and a transparent region. In the at least one sub-pixel, each sub-pixel includes at least one thin film transistor, a capacitor and a self-luminescent device that are located in the light-emitting region of the sub-pixel. The self-luminescent device is disposed on a side of the capacitor away from the at least one thin film transistor in a direction perpendicular to the first base. The at least one thin film transistor and the capacitor are electrically connected.

In some embodiments, the capacitor includes a first electrode incapable of transmitting light. An orthographic projection of the self-luminescent device on the first base is within a range of an orthographic projection of the first electrode on the first base. Or, an orthographic projection of the at least one thin film transistor on the first base is within the range of the orthographic projection of the first electrode on the first base. Or, the orthographic projection of the self-luminescent device on the first base is within the range of an orthographic projection of the first electrode on the first base, and the orthographic projection of the at least one thin film transistor on the first base is within the range of the orthographic projection of the first electrode on the first base.

In some embodiments, the self-luminescent device further includes an anode disposed at a side of the first electrode away from the first base, and the anode is further used as a second electrode of the capacitor. The transparent display substrate further includes a first insulating layer disposed between the first electrode and the second electrode.

In some embodiments, the self-luminescent device further includes: a cathode disposed at a side of the anode away from the first base, wherein the cathode is capable of transmitting light; and a light-emitting functional layer disposed between the cathode and the anode.

In some embodiments, a material of the anode includes a transparent conductive material, and a material of the cathode includes a metal material.

In some embodiments, the first electrode has a single-layer structure, and the single-layer structure includes a reflective electrode capable of reflecting light. Or, the first electrode has a multi-layer structure, and the multi-layer structure includes at least one reflective electrode layer capable of reflecting light and at least one transparent electrode layer capable of transmitting light that are stacked.

In some embodiments, the at least one thin film transistor includes a driving thin film transistor. The driving thin film transistor includes a first gate, a first source and a first drain. The first gate is electrically connected to the first electrode.

In some embodiments, a portion of the first insulating layer located in the light-emitting region is provided with a first via hole. The second electrode is electrically connected to the first drain or the first source through the first via hole.

In some embodiments, the at least one thin film transistor further includes a first switching thin film transistor. The first switching thin film transistor includes a second gate, a second source and a second drain. The transparent display substrate further includes a data line and a gate line. The second source is electrically connected to a data line, the second gate is electrically connected to a gate line, and the second drain is electrically connected to the first electrode.

In some embodiments, the driving thin film transistor and the first switching thin film transistor are both top-gate thin film transistors. The first gate and the second gate are disposed in a same layer. The first source, the second source, the first drain and the second drain are disposed in a same layer.

In some embodiments, the transparent display substrate further includes a second insulating layer disposed between the capacitor and the at least one thin film transistor. The second insulating layer covers at least a display region of the transparent display substrate.

In some embodiments the transparent display substrate further includes a planarization layer disposed between the second insulating layer and the capacitor. The planarization layer does not cover or substantially does not cover the transparent region of each sub-pixel.

In some embodiments, a portion of the second insulating layer located in the light-emitting region is provided with a second via hole, a third via hole and a fourth via hole. A portion of the planarization layer located in the light-emitting region is provided with a fifth via hole communicating with the second via hole, a sixth via hole communicating with the third via hole and a seventh via hole communicating with the fourth via hole. In a case where the at least one thin film transistor includes the driving thin film transistor and the first switching thin film transistor, a first electrode of the capacitor is electrically connected to a second drain of the first switching thin film transistor through the second via hole and the fifth via hole, and the first electrode of the capacitor is electrically connected to a first gate of the driving thin film transistor through the third via hole and the sixth via hole. A second electrode of the capacitor is electrically connected to a first source or a first drain of the driving thin film transistor through the fourth via hole and the seventh via hole.

In another aspect, a method for manufacturing a transparent display substrate provided. The manufacturing method includes: providing a first base; and forming a plurality of sub-pixels on the first base, at least one sub-pixel of the plurality of sub-pixels having a light-emitting region and a transparent region; wherein, in the at least one sub-pixel, each sub-pixel includes at least one thin film transistor, a capacitor and a self-luminescent device that are sequentially formed in the light-emitting region of the sub-pixel; the self-luminescent device is disposed on a side of the capacitor away from the at least one thin film transistor in a direction perpendicular to the first base; and the at least one thin film transistor and the capacitor are electrically connected to form at least a part of a driving circuit for driving the self-luminescent device to emit light.

In some embodiments, forming the plurality of sub-pixels on the first base includes:

forming an active layer, a gate insulating layer, a gate metal layer and a source-drain metal layer on the first base, wherein the active layer, the gate insulating layer, the gate metal layer and the source-drain metal layer form the at least one thin film transistor; the at least one thin film transistor includes a driving thin film transistor and a first switching thin film transistor, the driving thin film transistor includes a first gate, a first source and a first drain, and the first switching thin film transistor includes a second gate, a second source and a second drain;

forming a first electrode layer at a side of the source-drain metal layer away from the first base, wherein the first electrode layer includes a first electrode of the capacitor; and the first electrode of the capacitor is electrically connected to the first gate and the second drain;

forming a first insulating layer on a side of the first electrode layer away from the first base; and forming a second electrode layer on a side of the first insulating layer away from the first base, wherein the second electrode layer includes a second electrode of the capacitor, and the second electrode of the capacitor is electrically connected to the first source or the first drain.

In yet another aspect, a transparent display panel is provided. The transparent display panel includes the transparent display substrate according to any one of the above embodiments.

In some embodiments, the transparent display panel further includes a cover plate disposed on a side of the transparent display substrate. The cover plate includes a second base, and a color filter layer and a black matrix that are disposed on the second base. The color filter layer and the black matrix are located in regions corresponding to light-emitting regions of the transparent display substrate.

In some embodiments, the color filter layer includes a plurality of filter portions, and the plurality of filter portions are in one-to-one correspondence with a plurality of light-emitting regions of the transparent display substrate.

In some embodiments, the cover plate further includes: a third insulating layer disposed on a side of the color filter layer away from the second base; and an auxiliary electrode disposed on a side of the third insulating layer away from the second base. The auxiliary cathode is electrically connected to a cathode included in the self-luminescent device of the transparent display substrate.

In some embodiments, an orthographic projection of the auxiliary cathode on the second base is within a range of an orthographic projection of the black matrix on the second base.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals that the embodiments of the present disclosure relate to.

DETAILED DESCRIPTION

The technical solutions in some embodiments of the present disclosure will be described below clearly and completely with reference to the accompanying drawings. Obviously, the described embodiments are merely some but not all embodiments of the present disclosure. All other embodiments obtained on the basis of the embodiments of the present disclosure by a person of ordinary skill in the art shall be included in the protection scope of the present disclosure.

Unless the context requires otherwise, the term "comprise" and other forms thereof, such as the third-person singular form "comprises" and the present participle form "comprising", in the description and the claims are construed as open and inclusive, i.e., "inclusive, but not limited to". In the description, terms such as "one embodiment", "some embodiments", "exemplary embodiments", "example", "specific example", or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

In addition, the terms such as "first" and "second" are, used for descriptive purposes only and are not to be construed as indicating or implying relative importance or implicitly indicating the number of indicated technical features below. Thus, features defined as "first" and "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the terms such as "coupled" or "communicatively coupled" may also mean that two or more components are not in direct contact with each other but still cooperate or interact with each other. The embodiments disclosed herein are not necessarily limited to the contents herein.

Figure 1:
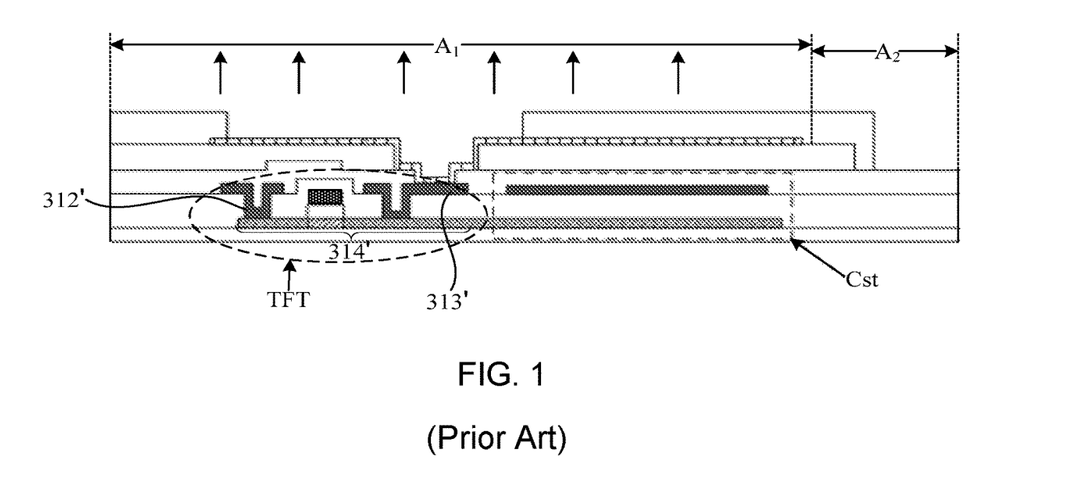
FIG. 1 is a cross-sectional diagram of a sub-pixel in the related art.

In the related art, in order to improve transparency of a transparent display device to improve a display effect, an area occupied by a light-emitting region needs to be reduced as much as possible. In a case where a storage capacitor is disposed in the light-emitting region, the storage capacitor is usually formed by extending a partial structure of a thin film transistor (TFT). That is, as shown in FIG. 1, the storage capacitor Cst is located at a side of a top light-emitting device proximate to a base. One electrode of the storage capacitor Cst is formed by extending an active layer 314' of the TFT, and the other electrode of the storage capacitor Cst is disposed in a same layer as a source 312' and a drain 313'. The storage capacitor Cst only occupies part of the light-emitting region $A_1$. Therefore, in a case where transparency of the display substrate is improved by increasing an area of the transparent region $A_2$, an area occupied by the storage capacitor Cst is reduced as the area of the light-emitting region $A_1$ is reduced. In this case, although the transparency of the display substrate is increased to a certain extent, pixel capacitance is reduced due to the reduction of the area occupied by the storage capacitor Cst, which makes a display mura, i.e., a phenomenon of uneven display brightness, easy to occur under influence of parasitic capacitance.

Figure 2:
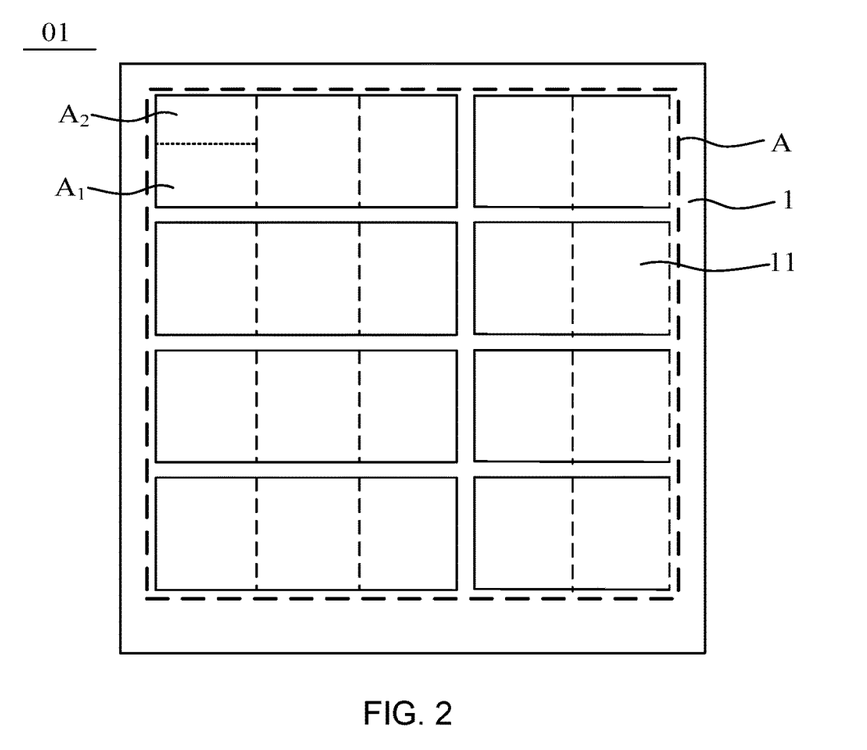
FIG. 2 is a top view of a transparent display substrate, in accordance with some embodiments of the present disclosure.

On this basis, some embodiments of the present disclosure provide a transparent display substrate. As shown in FIG. 2, the transparent display substrate 01 includes a first base 1 and a plurality of sub-pixels 11 disposed on the first base 1. At least one sub-pixel 11 of the plurality of sub-pixels 11 includes a light-emitting region $A_1$ and a transparent region $A_2$. The at least one sub-pixel 11 may be at least one sub-pixel located in a display region A, or at least one sub-pixel located in a non-display region (i.e., a dummy pixel).

Figure 3:
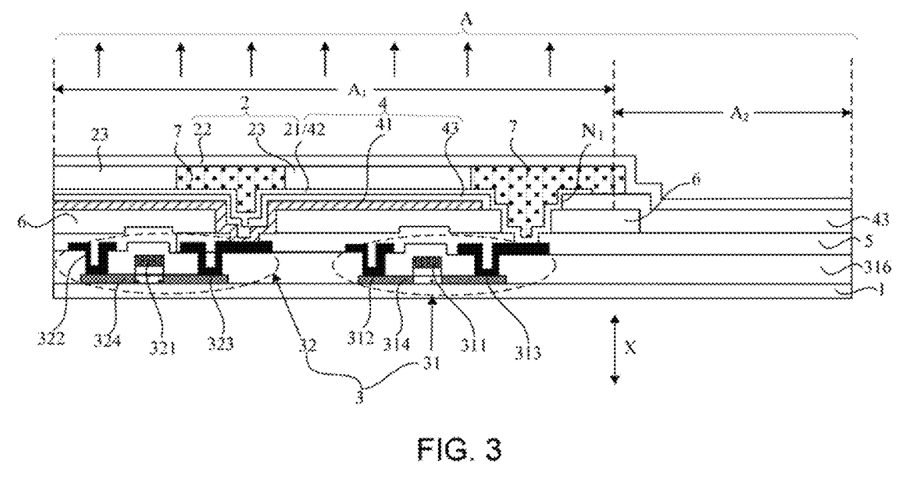
FIG. 3 is a cross-sectional diagram of a sub-pixel, in accordance with some embodiments of the present disclosure.

As shown in FIG. 3, in the at least one sub-pixel 11, each sub-pixel 11 includes at least one thin film transistor 3, a capacitor 4 and a self-luminescent device 2 that are located in the light-emitting region $A_1$ of the sub-pixel 11. The self-luminescent device 2 is disposed on a side of the capacitor 4 away from the at least one thin film transistor 3 in a direction X perpendicular to the first base 1. The at least one thin film transistor 3 and the capacitor 4 are electrically connected to form at least a part of a driving circuit for driving the self-luminescent device 2 to emit light.

For at least one thin film transistor 3 and the capacitor 4, since the at least one thin film transistor 3 and the capacitor 4 form at least a part of the driving circuit for driving the self-luminescent device 2 to emit light, a person skilled in the art will understand that, no matter how the at least one thin film transistor 3 and the capacitor 4 in the driving circuit are arranged, on a basis that the driving circuit drives the self-luminescent device 2 to emit light, the capacitor 4 needs to be electrically connected to at least one thin film transistor 3.

In addition, a manner in which the capacitor 4 is connected to at least one thin film transistor 3 is not limited herein, as long as the at least one thin film transistor 3 can provide different potentials for a first electrode and a second electrode of the capacitor 4.

In embodiments of the present disclosure, since the self-luminescent device 2 is disposed on a side of the capacitor 4 away from the at least one thin film transistor 3, compared with a fact that the capacitor only occupies part of the light-emitting region $A_1$ (e.g., the storage capacitor Cst being located at a side of the TFT in FIG. 1) in the related art, an area occupied by the capacitor 4 in the embodiments of the present disclosure is larger. The area occupied by the capacitor 4 may be determined by the area of the light-emitting region $A_1$. For example, the area occupied by the capacitor 4 may be substantially equal to the area of the light-emitting region $A_1$. In this way, in the case where an area of the transparent region $A_2$ is increased, although the area of the light-emitting region $A_1$ is reduced, a certain pixel capacitance value may still be ensured, thereby preventing the occurrence of the display mura.

It will be noted that, the first base 1 may be a flexible base or a rigid base such as a glass substrate. In some examples, a buffer layer may be provided between the first base 1 and the at least one thin film transistor 3. In this way, it is possible to avoid a subsequent problem of poor film-forming quality caused by entry of impurities of the first base 1 into the active layer of the at least one thin film transistor 3 or unevenness of the first base 1 itself, thereby ensuring performance of the at least one thin film transistor 3.

In some embodiments, as shown in FIG. 3, the capacitor 4 includes the first electrode 41. The first electrode 41 of the capacitor 4 is configured to be incapable of transmitting light, that is, the first electrode 41 of the capacitor 4 is opaque. On this basis, an orthographic projection of the self-luminescent device 2 on the first base 1 may be within a range of an orthographic projection of the first electrode 41 of the capacitor 4 on the first base 1. Here, it will be noted that, the self-luminescent device 2 includes at least an anode, a light-emitting layer and a cathode. In a case where each self-luminescent device 2 is separately provided with a light-emitting layer, the orthographic projection of the self-luminescent device 2 on the first base 1 may only refer to an orthographic projection of the light-emitting layer on the first base 1. In this way, in a case where the self-luminescent device 2 is a double-sided light-emitting device, the first electrode 41 of the capacitor 4 may prevent light emitted by the self-luminescent device 2 from being irradiated onto the at least one thin film transistor 3, thereby preventing the performance of the at least one thin film transistor 3 from being affected. In addition, an orthographic projection of the at least one thin film transistor 3 on the first base 1 may also be within the range of the orthographic projection of the first electrode 41 of the capacitor 4 on the first base 1. Here, it will be noted that, when the light is irradiated onto the active layer of the thin film transistor 3, the performance of the thin film transistor 3 is greatly affected. Therefore, the orthographic projection of the at least one thin film transistor 3 on the first base 1 may only refer to an orthographic projection of the respective active layer on the first base 1. In this way, in the case where the self-luminescent device 2 is a double-sided light-emitting device, the first electrode 41 of the capacitor 4 may prevent the light emitted by the self-luminescent device 2 from being irradiated onto the active layer of the at least one thin film transistor 3, thereby preventing the performance of the at least one thin film transistor 3 from being affected.

Referring to FIG. 3, the self-luminescent device 2 includes the anode 21 and the cathode 22 that are sequentially disposed above the first base 1. The cathode 22 is configured to be capable of transmitting light. The self-luminescent device 2 is disposed on a side of the capacitor 4 away from the at least one thin film transistor 3.

For the self-luminescent device 2, the self-luminescent device 2 may be a top light-emitting device or the double-sided light-emitting device, which is not specifically limited herein.

As shown in FIG. 3, the self-luminescent device 2 may further include a light-emitting functional layer 23 disposed between the anode 21 and the cathode 22.

As for the light-emitting functional layer 23, each self-luminescent device 2 may be separately provided with a light-emitting functional layer 23. Or, the light-emitting functional layer 23 may be arranged as a whole layer to cover the display region A. In a case where the light-emitting functional layer 23 is arranged as a whole layer, the light-emitting functional layer 23 emits white light and may be formed through evaporation by using an open mask.

The light-emitting functional layer 23 may include the light-emitting layer, a hole transport layer and an electron transport layer. Moreover, the light-emitting function layer 23 may further include a hole injection layer and an electron injection layer. A material of the light-emitting layer may be an organic light-emitting material or a quantum dot light-emitting material.

As for the cathode 22, in order to facilitate power supply to the cathode 22, the cathode 22 may cover the display region A. That is, the cathode 22 is also located in the transparent region $A_2$ in addition to the light-emitting region $A_1$.

In some embodiments of the present disclosure, as shown in FIG. 3, the anode 21 is also used as the second electrode of the capacitor 4, and the first electrode 41 and the second electrode 42 of the capacitor 4 are separated by a first insulating layer 43.

In the embodiments, by using the anode 21 as the second electrode 42 of the capacitor 4, it is possible to avoid adding an additional electrode as the second electrode 42 of the capacitor 4 in the light-emitting region $A_1$, thereby reducing a thickness of the light-emitting region $A_1$.

In addition, in the embodiments, the first electrode 41 and the second electrode 42 of the capacitor 4 are separated by the first insulating layer 43, and it will be seen from a parallel plate capacitance formula that, capacitance value of the capacitor 4 is inversely proportional to a distance between the two electrodes forming the capacitor 4. Therefore, by controlling a thickness of the first insulating layer 43 between the two electrodes of the capacitor 4, the capacitance value of the capacitor 4 may be met requirements.

It will be noted that, as described above, the self-luminescent device 2 may be the top light-emitting device or the doubled-sided light-emitting device. In a case where the self-luminescent device 2 is the top light-emitting device, a material of the anode 21 of the self-luminescent device 2 may include a metal material. For example, the anode 21 has a stacked structure having a first transparent electrode, a metal reflective electrode, and a second transparent electrode (e.g., ITO/Ag/ITO). In the case where the self-emitting device 2 is the double-sided light-emitting device, the material of the anode 21 may be a transparent conductive material.

In some embodiments, the material of the anode 21 is the transparent conductive material, and a material of the cathode 22 is a metal material. The first electrode of the capacitor 4 has a single-layer structure or a stacked multi-layer structure. The single-layer structure includes a reflective electrode capable of reflecting light, e.g., the metal reflective electrode. The multi-layer structure includes at least one reflective electrode layer capable of reflecting light and at least one transparent electrode layer capable of transmitting light.

The first electrode of the capacitor 4 includes the metal reflective electrode, and thus may play a reflective role. In this way, on one hand, effect of work function of the metal on luminescent efficiency of the self-luminescent device 2 may be reduced. On the other hand, difficulty in designing a micro-cavity structure may be reduced by using the thickness of the intermediate first insulating layer 43.

Figure 4:
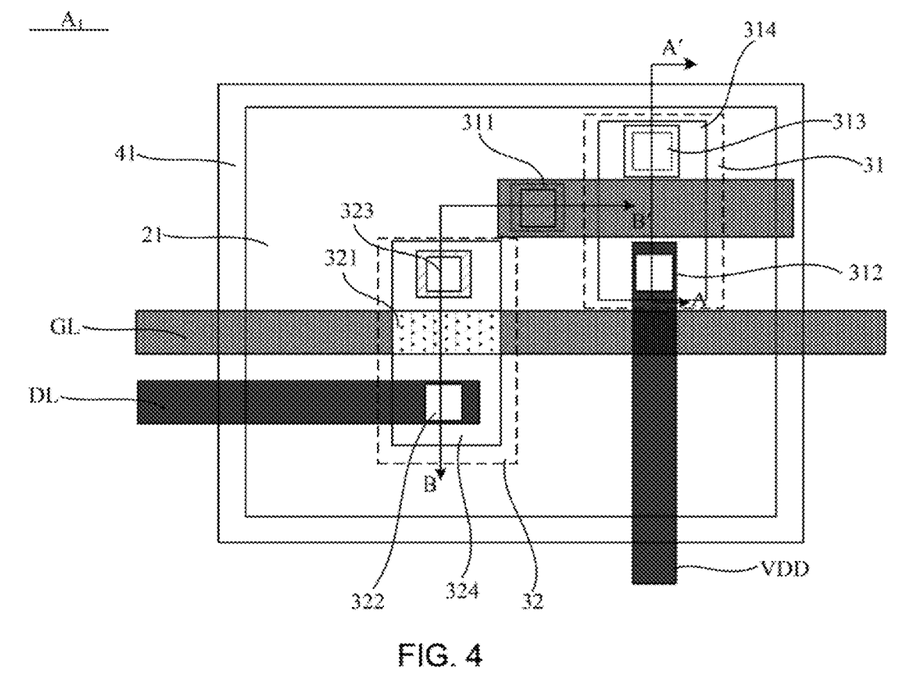
FIG. 4 is a top view of a light-emitting region, in accordance with some embodiments of the present disclosure.
Figure 6:
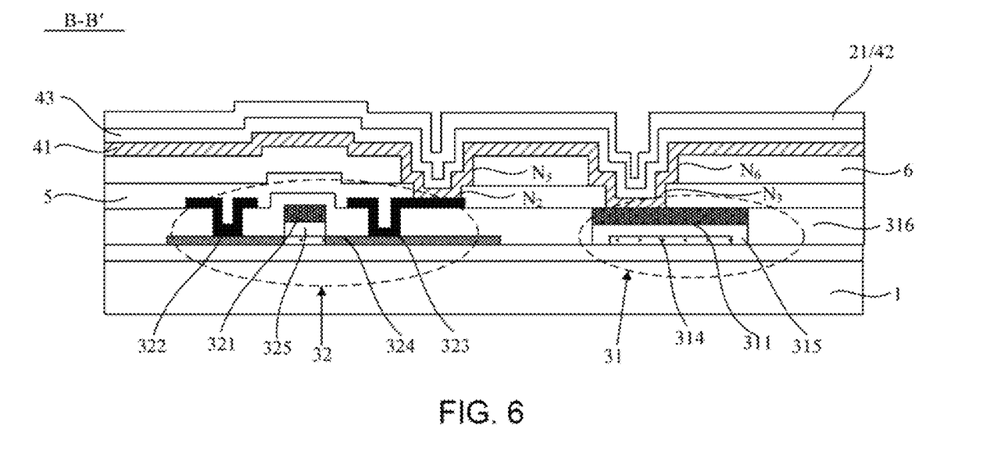
FIG. 6 is a cross-sectional diagram taken along direction B-B' in FIG. 4, in accordance with some embodiments of the present disclosure.

In some examples, referring to FIGS. 3, 4 and 6, the at least one thin film transistor 3 includes a driving, thin film transistor 31. The driving thin film transistor 31 includes a first gate 311, and the first electrode 41 of the capacitor 4 is electrically connected to the first gate 311 of the driving thin film transistor 31.

It will be understood that, as shown in FIG. 4, the driving thin film transistor 31 may further include a first source 312 and a first drain 313. The first source 312 is electrically connected to a power supply line VDD, and the first drain 313 is electrically connected to the anode 21 of the self-luminescent device 2. Alternatively, the first drain 313 is electrically connected to the power supply line VDD, and the first source 312 is electrically connected to the anode 21 of the self-luminescent device 2. In addition, referring to FIG. 3, in a case where the first insulating layer 43 is provided on a side of the anode 21 proximate to the first base 1, a first via hole $N_1$ may be provided in a portion of the first insulating layer 43 that is located in the light-emitting region, so that the anode 21 may be electrically connected to the first source 312 or the first drain 313 through the first via hole.

Figure 5:
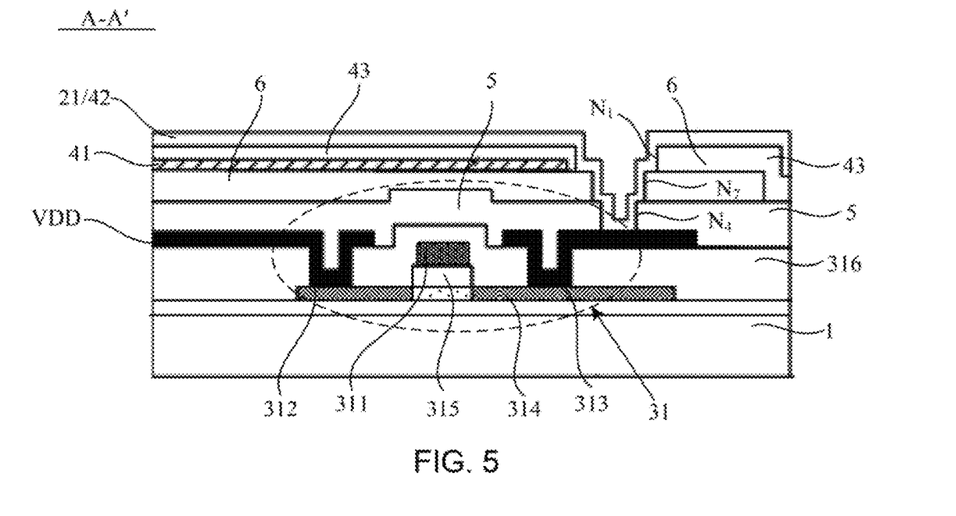
FIG. 5 is a cross-sectional diagram taken along direction A-A' in FIG. 4, in accordance with some embodiments of the present disclosure.

On this basis, in case where the anode 21 is also used as the second electrode of the capacitor 4, as shown in FIGS. 3 and 5, the second electrode 42 of the capacitor 4 is electrically connected to the first drain 313 or the first source 312 of the driving thin film transistor 31. FIG. 5 shows an example in which the second electrode 42 of the capacitor 4 is electrically connected to the first drain 313 of the driving thin film transistor 31.

On this basis, in some embodiments of the present disclosure, as shown in FIGS. 3, 4 and 6, the at least one thin film transistor 3 further includes at least one switching thin film transistor, and the at least one switching thin film transistor includes a first switching thin film transistor 32. The first switching thin film transistor 32 includes a second gate 321, a second source 322 and a second drain 323. The second source 322 is electrically connected to a data line DL, the second gate 321 is electrically connected to a gate line GL, and the second drain 323 is electrically connected to the first electrode 41 of the capacitor 4.

Since the first electrode 41 of the capacitor 4 is also electrically connected to the first gate 311 of the driving thin film transistor 31, in a case where the second drain 323 is electrically connected to the first electrode 41 of the capacitor 4, the second drain 323 and the first gate 311 may be electrically connected through the first electrode 41 of the capacitor 4.

The first switching thin film transistor and the driving thin film transistor may be top-gate thin film transistors or bottom-gate thin film transistors. The bottom-gate thin film transistor may be divided into a back-channel-etch (BCE) type thin film transistor and an etch-stop (ES) type thin film transistor.

It will be noted that, for the at least one thin film transistor 3 the embodiments of the present disclosure do not limit this. The at least one thin film transistor 3 may include two thin film transistors as above (e.g., one driving thin film transistor and one first switching thin film transistor) which are electrically connected, or may include more than two thin film transistors (e.g., one driving thin film transistor and a plurality of first switching thin film transistors) which are electrically connected.

In some examples of the present disclosure, as shown in FIG. 3, the driving thin film transistor and the first switching thin film transistor are both the top-gate thin film transistors. The first gate 311 and the second gate 321 are arranged in a same layer, and the first source 312, the second source 322, the first drain 313 and the second drain 323 are arranged in a same layer.

In this way, the first gate 311 and the second gate 321 may be formed through a same patterning process, and the second source 322, the first source 312, the first drain 313 and the second drain 323 may also be formed through another same patterning process. Therefore, a process of manufacturing the transparent display substrate may be simplified, manufacturing difficulty may be reduced and manufacturing efficiency may be improved.

In addition, it will be noted that, FIG. 4 shows an example in which the gate line GL is shared with the second gate 321. However, the embodiments of the present disclosure are not limited thereto, and the gate line GL and the second gate 321 may be arranged separately.

Figure 7:
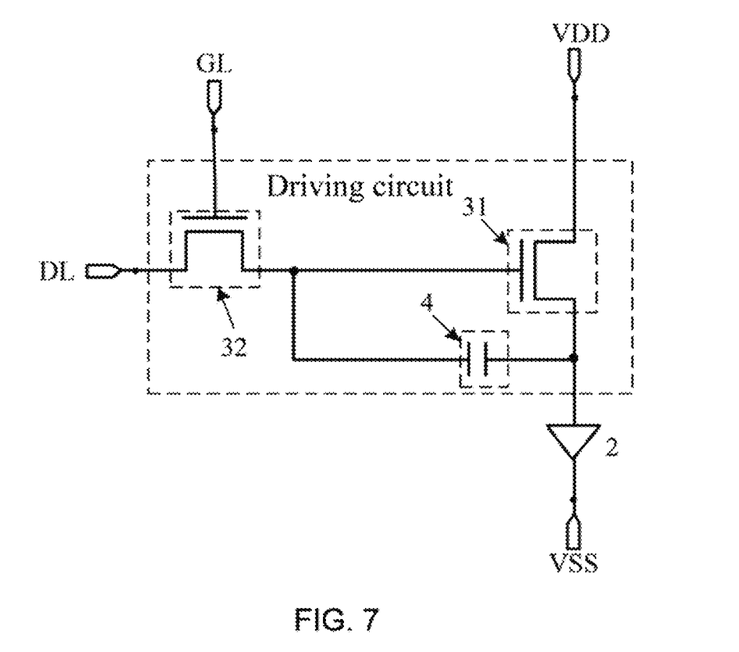
FIG. 7 is an equivalent circuit diagram of a driving circuit, in accordance with some embodiments of the present disclosure.

On this basis, an equivalent circuit diagram of a driving circuit composed of a first switching thin film transistor 32, a driving thin film transistor 31 and the capacitor 4 is shown in FIG. 7. When the gate line GL transmits a signal, the first switching thin film transistor 32 is turned on to transmit an input signal on the data line DL to the first gate 311 of the driving thin film transistor 31, so as to charge the capacitor 4. When the gate line GL stops transmitting the signal, a voltage on the first gate 311 of the driving thin film transistor 31 is maintained by the capacitor 4.

On a basis of the above description, it will be noted that, a reason why the transparent region $A_2$ is referred to as the "transparent region" is that each film layer disposed in this region is light-transmissive. That is, the transparent region $A_2$ is transparent as a whole. The transparent region $A_2$ is not used for display.

The film layers of the transparent region $A_2$ are not specifically limited. The transparent region $A_2$ may be formed by extending light-transmissive film layers in the light-emitting region $A_1$.

In some examples of the present disclosure, the transparent region $A_2$ may be formed by extending light-transmissive film layers such as the first base 1, the buffer layer, the first insulating layer 43 and the cathode 22.

In some embodiments of the present disclosure, referring to FIG. 3, a second insulating layer 5 and a planarization layer 6 are further provided between the capacitor 4 and the at least one thin film transistor 3. The second insulating layer 5 covers the display region A. The planarization layer 6 does not cover or substantially does not cover the transparent region $A_2$. In the embodiments, by making the planarization layer 6 only cover the light-emitting region $A_1$, an overall thickness of the film layers in the transparent region $A_2$ may be reduced, thereby improving transparency of the transparent region $A_2$, and further improving transparency of the transparent display substrate. For example, the second insulating layer 5 is an inorganic insulating layer, and the planarization layer 6 is an organic planarization layer.

In the above embodiments, as shown in FIGS. 5 and 6, a second via hole $N_2$, a third via hole $N_3$ and a fourth via hole $N_4$ are provided in a portion of the second insulating layer 5 located in the light-emitting region. A portion of the planarization layer 6 located in the light-emitting region has a fifth via hole $N_5$ communicating with the second via hole $N_2$, a sixth via hole $N_6$ communicating with the third via hole $N_3$ and a seventh via hole $N_7$ communicating with the fourth via hole $N_4$.

In a case where the at least one thin film transistor 3 includes the driving thin film transistor 31 and the first switching thin film transistor 32, as shown in FIGS. 5 and 6, the first electrode 41 of the capacitor 4 is electrically connected to the second drain 323 of the first switching thin film transistor 32 through the second via hole $N_2$ and the fifth via hole $N_5$, and the first electrode 41 of the capacitor 4 is electrically connected to the first gate 311 of the driving thin film transistor 31 through the third via hole $N_3$ and the sixth via hole $N_6$. The second electrode 42 of the capacitor 4 is electrically connected to the first source or the first drain of the driving thin film transistor through the fourth via hole $N_4$ and the seventh via hole $N_7$. In a case where the first insulating layer 43 is provided, the second electrode 42 of the capacitor 4 is electrically connected to the first source or the first drain of the driving thin film transistor through the first via hole $N_1$, the fourth via hole $N_4$ and the seventh via hole $N_7$.

Figure 8:
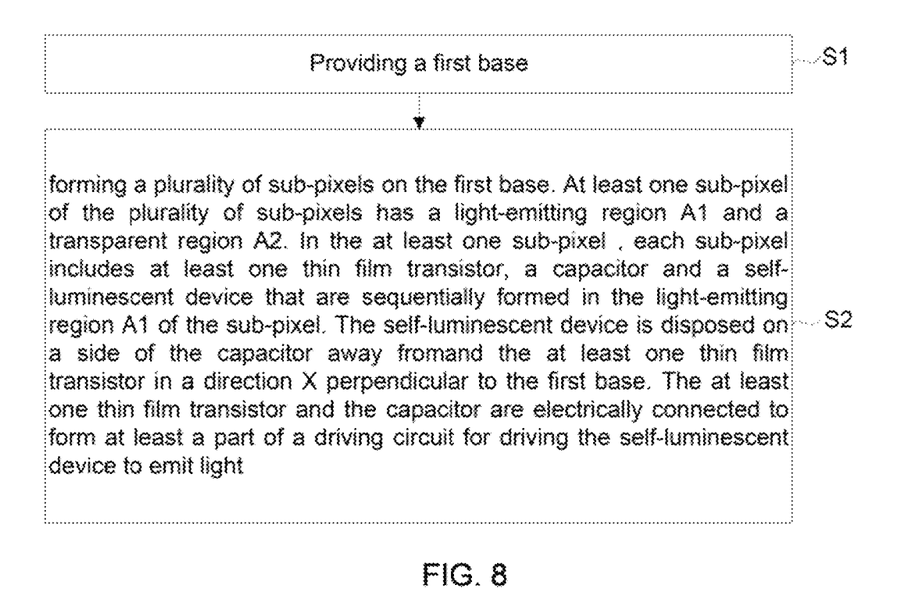
FIG. 8 is a flow diagram of a method for manufacturing a transparent display substrate, in accordance with some embodiments of the present disclosure.

Taking an example in which a sub-pixel 11 includes the light-emitting region $A_1$ and the transparent region $A_2$, and at least one thin film transistor 3 located in the light-emitting region $A_1$ includes a first switching thin film transistor and a driving thin film transistor, referring to FIGS. 2 to 9, a method for manufacturing a transparent display substrate 01 is provided below. As shown in FIGS. 2, 3, and 8, the manufacturing method includes:

S1, providing a first base 1, wherein the first base 1 may be a flexible base or a rigid base such as a glass substrate; and S2, forming a plurality of sub-pixels 11 on the first base 1. At least one sub-pixel 11 of the plurality of sub-pixels 11 has a light-emitting region $A_1$ and a transparent region $A_2$. In the at least one sub-pixel 11, each sub-pixel 11 includes at least one thin film transistor 3, a capacitor 4 and a self-luminescent device 2 that are sequentially formed in the light-emitting region $A_1$ of the sub-pixel 11. The self-luminescent device 2 is disposed on a side of the capacitor 4 away from the at least one thin film transistor 3 in a direction X perpendicular to the first base 1. The at least one thin film transistor 3 and the capacitor 4 are electrically connected to form at least a part of a driving circuit for driving the self-luminescent device 2 to emit light.

In the transparent display substrate manufactured by using the above manufacturing method provided by embodiments of the present disclosure, since the self-luminescent device 2 is disposed on a side of the capacitor 4 away from the at least one thin film transistor 3, compared with a fact that the capacitor only occupies part of the light-emitting region $A_1$ (e.g., the storage capacitor Cst being located at a side of the TFT in FIG. 1) in the related art, an area occupied by the capacitor 4 in the transparent display substrate formed in the embodiments is larger. In addition, the area occupied by the capacitor 4 may be determined by the area of the light-emitting region $A_1$. For example, the area occupied by the capacitor 4 may be substantially equal to the area of the light-emitting region $A_1$. In this way, when an area of the transparent region $A_2$ is increased, although the area of the light-emitting region $A_1$ is reduced, a certain pixel capacitance value may be ensured, thereby preventing occurrence of a display mura.

Figure 9:
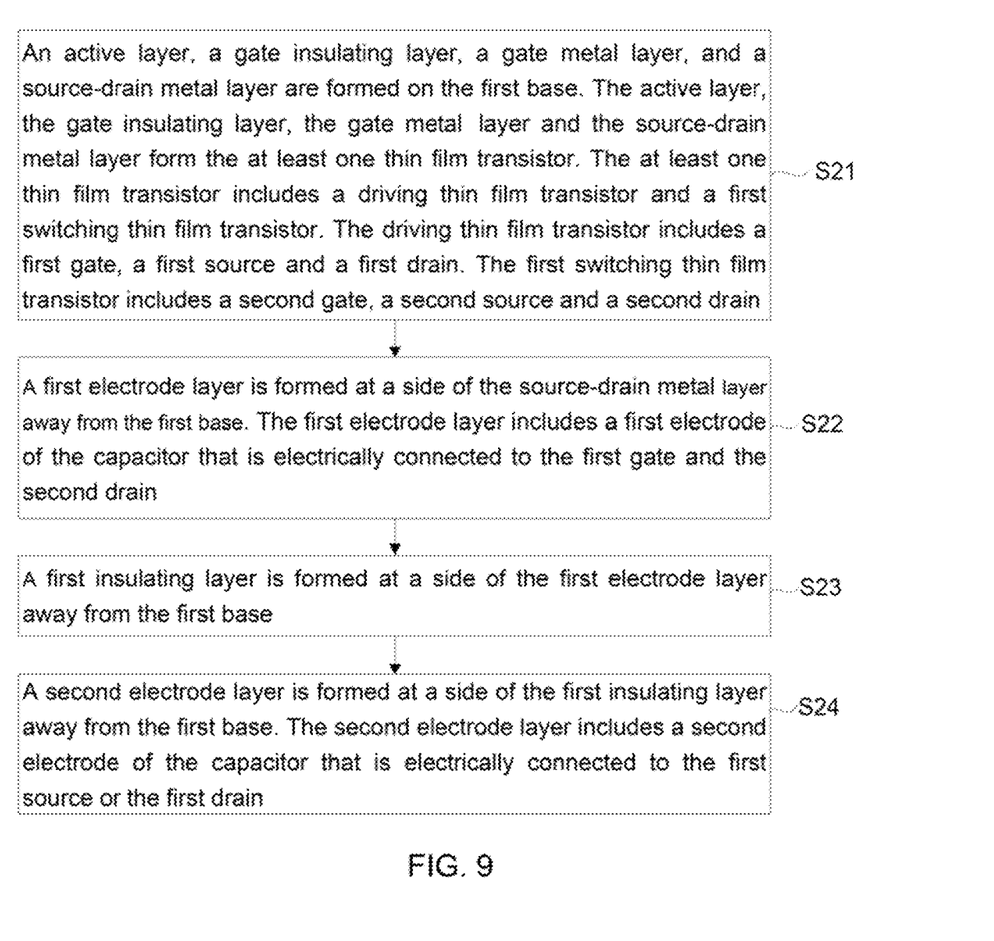
FIG. 9 is a flow diagram of another method for manufacturing a transparent display substrate, in accordance with some embodiments of the present disclosure.

For example, as shown in FIGS. 6 and 9, S2 includes S21 to S24.

In S21, an active layer, a gate insulating layer, a gate metal layer, and a source-drain metal layer are formed on the first base. The active layer, the gate insulating layer, the gate metal layer and the source-drain metal layer form the at least one thin film transistor 3. The at least one thin film transistor 3 includes a driving thin film transistor 31 and a first switching thin film transistor 32. The driving thin film transistor 31 includes a first gate 311, a first source 312 and a first drain 313. The first switching thin film transistor 32 includes a second gate 321, a second source 322 and a second drain 323. In some examples, after the first base 1 is cleaned, a buffer layer may be deposited on the cleaned first base 1. Then, a semiconductor material is deposited and patterned to form the active layer. The active layer includes a first active layer 314 of the driving thin film transistor 31 and a second active layer 324 of the switching thin film transistor 32. It will be understood that, the first active layer 314 and the second active layer 324 are both located in the light-emitting region $A_1$.

On this basis, for example, an insulating material and a metal material may be continuously deposited, and the gate insulating layer and the gate metal layer are formed through a self-aligned technology. The gate insulating layer includes a first gate insulating pattern 315 and a second gate insulating pattern 325 that are located in the light-emitting region $A_1$. The first gate insulating pattern 315 is located on the first active layer 314, and the second gate insulating pattern 325 is located on the second active layer 324. The gate metal layer includes the first gate 311 and the second gate 321 that are located in the light-emitting region $A_1$. The first gate 311 is located on the first gate insulating pattern 315, and the second gate 321 is located on the second gate insulating pattern 325.

Then, an interlayer insulating layer 316 is deposited through a deposition process, and is etched to form via holes for electrical connection. Then, a metal material is deposited and is patterned to form the source-drain metal layer. The source-drain metal layer includes the first source 312, the first drain 313, the second source 322 and the second drain 323. The first source 312 and the first drain 313 are located above the first active layer 314, and are in contact with the first active layer 314 through via holes in the interlayer insulating layer 316. The second source 322 and the second drain 323 are located above the second active layer 324, and are in contact with the second active layer 324 through via holes in the interlayer insulating layer 316. Thus, the driving thin film transistor 31 and the first switching thin film transistor 32 are formed.

In S22, a first electrode layer is formed at a side of the source-drain metal layer away from the first base 1. The first electrode layer includes a first electrode 41 of the capacitor 4. The first electrode 41 of the capacitor 4 is electrically connected to the first gate 311 and the second drain 323.

In S23, a first insulating layer 43 is formed on a side of the first electrode layer away from the first base 1.

In S24, a second electrode layer is formed on a side of the first insulating layer 43 away from the first base 1. The second electrode layer includes a second electrode 42 of the capacitor 4. The second electrode 42 of the capacitor 4 is electrically connected to the first source 312 or the first drain 313.

For example, before the first electrode layer, the first insulating layer 43 and the second electrode layer are formed, the method further includes forming a second insulating layer 5 (e.g., an inorganic insulating layer) and a planarization layer 6 (e.g., an organic planarization layer). For example, the second insulating layer 5 may be deposited through the deposition process, and is etched to form via holes for electrical connection (e.g., a second via hole $N_2$, a third via hole $N_3$ and a fourth via hole $N_4$ in FIGS. 5 and 6). Then, an organic planarization material (e.g., a resin material) is coated to form the planarization layer 6, which is then etched to form via holes for electrical connection (e.g., a fifth via hole $N_5$, a sixth via hole $N_6$ and a seventh via hole $N_7$ in FIGS. 5 and 6). In addition, a portion of the planarization layer 6 in the transparent region $A_2$ is etched away to improve transparency of the transparent region $A_2$. Thus, after the first electrode 41 and the second electrode 42 of the capacitor 4 are formed, the first electrode 41 of the capacitor 4 may be electrically connected to the second drain 323 through the second via hole $N_2$ and the fifth via hole $N_5$, and may be electrically connected to the first gate 311 through the third via hole $N_3$ and the sixth via hole $N_6$; the second electrode 42 of the capacitor 4 may be electrically connected to the first source 312 or the first drain 313 through the fourth via hole $N_4$ and the seventh via hole $N_7$. It will be noted that, in order to electrically connect the second electrode 42 of the capacitor 4 to the first source 312 or the first drain 313, the subsequently formed first insulating layer 43 is etched to form a first via hole $N_1$. Therefore, the second electrode 42 of the capacitor 4 may be electrically connected to the first source 312 or the first drain 313 through the first via hole $N_1$, the fourth via hole $N_4$ and the seventh via hole $N_7$. FIG. 5 shows that the second electrode 42 of the capacitor 4 is electrically connected to the first drain 313 through the first via hole $N_1$, the fourth via hole $N_4$ and the seventh via hole $N_7$.

In some examples, the first electrode layer, the first insulating layer 43 and the second electrode layer may be formed through the following steps. For example, firstly, the metal material and a transparent conductive material (e.g., Ag or ITO) are sequentially deposited and patterned to form the first electrode layer. That is, the first electrode 41 of the capacitor 4 is formed in the light-emitting region $A_1$, and the first electrode 41 of the capacitor 4 is electrically connected to the second drain 323 and the first gate 311 through via holes formed in the second insulating layer 5 and the planarization layer 6. Then, the first insulating layer 43 is deposited, and is etched to form a via hole for electrical connection (i.e., the first via hole $N_1$). Finally, a transparent conductive material (e.g., ITO) is deposited and patterned to form the second electrode layer. That is, the second electrode 42 of the capacitor 4 is formed in the light-emitting region $A_1$, and the second electrode 42 is electrically connected to the first drain 313 through via holes formed in the second insulating layer 5, the planarization layer 6 and the first insulating layer 43.

For example, the second electrode 42 of the capacitor 4 may also be used as an anode 21 of the self-luminescent device 2. In this way, a pixel defining layer 7 (as shown in FIG. 3) may be directly formed subsequently, and the light-emitting region $A_1$ may be defined by the pixel defining layer 7. Then, the light-emitting functional layer 23 is formed by the evaporation process, and finally a cathode 22 is formed by the deposition process, thereby completing manufacturing of the self-luminescent device 2. For example, referring to FIG. 3, the pixel defining layer 7 includes portions enclosing light-emitting regions $A_1$ and portions for filling recessed regions (i.e., positions at which via holes are correspondingly arranged) in the light-emitting regions $A_1$. In this way, the subsequently formed light-emitting functional layer 23 may be flat. For example, a material for forming the pixel defining layer 7 is a transparent material.

It will be noted that, a material of a metal electrode in at least one thin film transistor 3 of the transparent display substrate 01 may be at least one of silver (Ag), copper (Cu), aluminum (Al), molybdenum (Mo) and alloy materials such as aluminum neodymium (AlNd) or molybdenum niobium (MoNb). The metal electrode may have a multi-layer metal structure, such as MoNb/Cu/MoNb. In addition, the metal electrode may also have a stacked structure of metal and transparent conductive oxide (e.g. ITO and AZO), such as Mo/AlNd/ITO and ITO/Ag/ITO.

A material of the active layer in the at least one thin film transistor 3 of the transparent display substrate 01 may be at least one of transparent amorphous indium gallium zinc oxide (a-IGZO), zinc oxynitride (ZnON), indium zinc tin oxide (IZTO), amorphous silicon (a-Si), polycrystalline, silicon (p-Si), hexathiophene and polythiophene.

Materials of the buffer layer, the gate insulating layer 315, the interlayer insulating layer 316 and the second insulating layer 5 include, but are not limited to, dielectric materials such as silicon oxide (SiOx), silicon nitride (SiNx) or silicon oxynitride (SiON), or various novel organic insulating materials, or high dielectric constant materials such as aluminum oxide (AlOx), hafnium oxide (HfOx) or tantalum oxide (TaOx). A material of the planarization layer 6 includes, but is not limited to, a polysiloxane-based material, an acrylic-based material or a polyimide-based material.

Some embodiments of the present disclosure provide a transparent display panel including the above transparent display substrate 01. The transparent display panel has same beneficial effects as the transparent display substrate, and the effects will not be repeated here.

Figure 10:
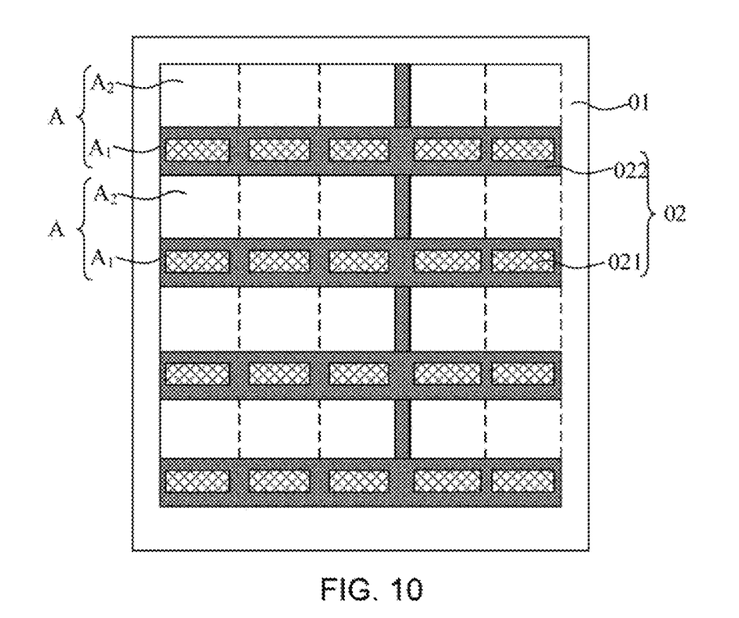
FIG. 10 is a top view of a transparent display panel, in accordance with some embodiments of the present disclosure.
Figure 11:
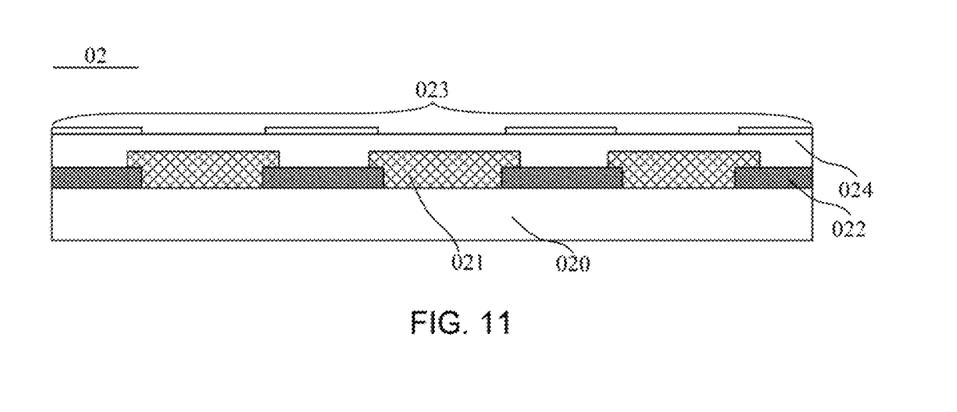
FIG. 11 is a cross-sectional diagram of a cover plate, in accordance with some embodiments of the present disclosure.

In some embodiments, as shown in FIGS. 10 and 11, the transparent display panel further includes a cover plate 02, and the cover plate 02 is disposed at a side of the transparent display substrate 01 proximate to the cathode. The cover plate 02 includes a second base 020, and a color filter layer and a black matrix 022 that are disposed on the second base 020. The color filter layer and the black matrix 022 are disposed in regions corresponding to light-emitting regions $A_1$ of the transparent display substrate 01. The second base 020 may be a flexible base, or a rigid base such as a glass substrate.

For example, as shown in FIG. 11, the color filter layer includes a plurality of filter portions 021, and the plurality of filter portions 021 are in one-to-one correspondence with a plurality of light-emitting regions $A_1$ of the transparent display substrate 01. For example, the color filter layer includes at least filter portions of three primary colors, i.e., filter portions of a first primary color (e.g., red filter portions), filter portions of a second primary color (e.g., green filter portions), and filter portions of a third primary color (e.g., blue filter portions). Each filter portion of the first primary color, each filter portion of the second primary color, and each filter portion of the third primary color are each located in a corresponding light-emitting region of a sub-pixel 11.

In this example, by forming the color filter layer and the black matrix 022 on the second base 020, the transparent display panel may be applied in a large-sized display. By providing the color filter layer and the black matrix 022 in the regions corresponding to the light-emitting regions $A_1$ of the transparent display substrate 01, the transparent region $A_2$ may be ensured to be transparent. For example, as shown in FIG. 10, a region of the cover plate 02 corresponding to a portion between two pixels (each pixel including three sub-pixels 11 in FIG. 10) is also provided with the black matrix. In this way, metal lines longitudinally disposed between the two pixels may be, shielded by the black matrix. Since there is no black matrix for shielding between transparent regions $A_2$ of any two adjacent sub-pixels 11 in each pixel, transparent regions $A_2$ of all sub-pixels 11 in each pixel may be connected together, thereby increasing a ratio of the transparent regions in the transparent display panel.

In some embodiments, as shown in FIG. 11, the cover plate 02 further includes a third insulating layer 024 disposed at a side of the color filter layer away from the second base 020, and an auxiliary cathode 023 disposed at a side of the third insulating layer 024 away from the second base 020. The auxiliary cathode 023 may be electrically connected to the cathode 22 of the transparent display substrate 01.

On this basis, for example, an orthographic projection of the auxiliary cathode 023 on the second base 020 is within a range of an orthographic projection of the black matrix 022 on the second base 020, which may avoid a decrease in an aperture ratio.

For example, a material of the auxiliary cathode 023 is e metal material. The auxiliary cathode 023 may have a same shape as the black matrix 022. That is, the auxiliary cathode 023 may have a mesh shape.

By providing the auxiliary cathode 023 on the second base 020, and by electrically connecting the auxiliary cathode 023 to the cathode 22 of the transparent display substrate 01, a voltage drop on the cathode 22 may be reduced.

The forgoing descriptions are merely specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:
1. A transparent display substrate, comprising:
   a first base;
   a plurality of sub-pixels disposed on the first base, at least one sub-pixel of the plurality of sub-pixels having a light-emitting region and a transparent region;
   wherein in the at least one sub-pixel, each sub-pixel includes a driving thin film transistor, a first switching thin film transistor, a capacitor, and a self-luminescent device that are located in the light-emitting region;

wherein the capacitor includes a first electrode incapable of transmitting light and a second electrode disposed at a side of the first electrode away from the first base, wherein the self-luminescent device is disposed on a side of the capacitor away from the driving thin film transistor and the first switching thin film transistor in a direction perpendicular to the first base;

wherein the self-luminescent device includes an anode being further used as the second electrode of the capacitor;

wherein the driving thin film transistor and the capacitor are electrically connected to each other;

wherein an orthographic projection of the driving thin film transistor on the first base is located entirely within a range of an orthographic projection of the second electrode on the first base; and wherein an orthographic projection of the first switching thin film transistor on the first base is located entirely within the range of the orthographic projection of the second electrode on the first base.

2. The transparent display substrate according to claim 1, further comprising:
a first insulating layer disposed between the first electrode and the second electrode.

3. The transparent display substrate according to claim 2, wherein the self-luminescent device further includes:
a cathode disposed at a side of the anode away from the first base, the cathode being capable of transmitting light; and
a light-emitting functional layer disposed between the cathode and the anode.

4. The transparent display substrate according to claim 3, wherein a material of the anode includes a transparent conductive material; and a material of the cathode includes a metal material.

5. The transparent display substrate according to claim 1, wherein the first electrode has a single-layer structure, and the single-layer structure includes a reflective electrode capable of reflecting light; or
the first electrode has a multi-layer structure that includes a stack of:
at least one reflective electrode layer capable of reflecting light, and
at least one transparent electrode layer capable of transmitting light.

6. The transparent display substrate according to claim 2, wherein the driving thin film transistor includes a first gate, a first source and a first drain; and
the first gate is electrically connected to the first electrode.

7. The transparent display substrate according to claim 6, wherein a portion of the first insulating layer located in the light-emitting region is provided with a first via hole; and
the second electrode is electrically connected to the first drain or the first source through the first via hole.

8. The transparent display substrate according to claim 6, wherein the first switching thin film transistor includes:
a second gate, a second source and a second drain; and
the transparent display substrate further comprises a data line and a gate line, the second source is electrically connected to the data line, the second gate is electrically connected to the gate line, and the second drain is electrically connected to the first electrode.

9. The transparent display substrate according to claim 8, wherein
the driving thin film transistor and the first switching thin film transistor are both top-gate thin film transistors; the first gate and the second gate are disposed in a same layer; the first source, the second source, the first drain and the second drain are disposed in a same layer.

10. The transparent display substrate according to claim 1, wherein the transparent display substrate further comprises:
a second insulating layer disposed between the capacitor and the at least one thin film transistor; the second insulating layer covering at least a display region of the transparent display substrate.

11. The transparent display substrate according to claim 10, wherein the transparent display substrate further comprises:
a planarization layer disposed between the second insulating layer and the capacitor; the planarization layer not covering a transparent region of each sub-pixel.

12. The transparent display substrate according to claim 11, wherein a portion of the second insulating layer located in the light-emitting region is provided with a second via hole, a third via hole and a fourth via hole;
a portion of the planarization layer located in the light-emitting region is provided with a fifth via hole communicating with the second via hole, a sixth via hole communicating with the third via hole and a seventh via hole communicating with the fourth via hole;
a first electrode of the capacitor is electrically connected to a second drain of the first switching thin film transistor through the second via hole and the fifth via hole, and the first electrode of the capacitor is electrically connected to a first gate of the driving thin film transistor through the third via hole and the sixth via hole; and
a second electrode of the capacitor is electrically connected to a first source or a first drain of the driving thin film transistor through the fourth via hole and the seventh via hole.

13. A transparent display panel, comprising the transparent display substrate according to claim 1.

14. The transparent display panel according to claim 13, wherein the transparent display panel further comprises:
a cover plate disposed on a side of the transparent display substrate, the cover plate including:
a second base; and
a color filter layer and a black matrix that are disposed on the second base; the color filter layer and the black matrix being located in regions corresponding to light-emitting regions of the transparent display substrate.

15. The transparent display panel according to claim 14, wherein the color filter layer includes a plurality of filter portions, and the plurality of filter portions are in one-to-one correspondence with a plurality of light-emitting regions of the transparent display substrate.

16. The transparent display panel according to claim 14, wherein the cover plate further includes:
a third insulating layer disposed on a side of the color filter layer away from the second base; and
an auxiliary cathode disposed on a side of the third insulating layer away from the second base, the auxiliary cathode being electrically connected to a cathode included in the self-luminescent device of the transparent display substrate.

17. The transparent display panel according to claim 16, wherein an orthographic projection of the auxiliary cathode on the second base is within a range of an orthographic projection of the black matrix on the second base.

18. A method for manufacturing a transparent display substrate, the method comprising:
providing a first base; and forming a plurality of sub-pixels on the first base, at least one sub-pixel of the plurality of sub-pixels having a light-emitting region and a transparent region;

wherein in the at least one sub-pixel, each sub-pixel includes a driving thin film transistor, a first switching thin film transistor, a capacitor, and a self-luminescent device that are formed in the light-emitting region;

wherein the capacitor includes a first electrode incapable of transmitting light and a second electrode formed at a side of the first electrode away from the first base, wherein the self-luminescent device is disposed on a side of the capacitor away from the driving thin film transistor and the first switching thin film transistor in a direction perpendicular to the first base;

wherein the self-luminescent device includes an anode being further used as the second electrode of the capacitor;

wherein the driving thin film transistor and the capacitor are electrically connected to each other;

wherein an orthographic projection of the driving thin film transistor on the first base is located entirely within a range of an orthographic projection of the second electrode on the first base; and wherein an orthographic projection of the first switching thin film transistor on the first base is located entirely within the range of the orthographic projection of the second electrode on the first base.

19. The manufacturing method according to claim 18, wherein forming the plurality of sub-pixels on the first base includes:

forming an active layer, a gate insulating layer, a gate metal layer and a source-drain metal layer on the first base, wherein the active layer, the gate insulating layer, the gate metal layer and the source-drain metal layer form the driving thin film transistor and the first switching thin film transistor, wherein the driving thin film transistor includes a first gate, a first source and a first drain, which are formed from the gate metal layer and the source-drain metal layer, respectively; and wherein the first switching thin film transistor includes a second gate, a second source, and a second drain, which are formed from the gate metal layer and the source-drain metal layer, respectively;

forming a first electrode layer at a side of the source-drain metal layer away from the first base, wherein the first electrode layer includes the first electrode of the capacitor; and the first electrode of the capacitor is electrically connected to the first gate and the second drain;

forming a first insulating layer on a side of the first electrode layer away from the first base; and forming a second electrode layer on a side of the first insulating layer away from the first base, wherein the second electrode layer includes the second electrode of the capacitor, and the second electrode of the capacitor is electrically connected to the first source or the first drain.

* * * * *

UNITED STATES PATENT AND TRADEMARK OFFICE
CERTIFICATE OF CORRECTION

PATENT NO. : 11,489,029 B2  
APPLICATION NO. : 16/964127  
DATED : November 1, 2022  
INVENTOR(S) : Zhen Song and Guoying Wang Page 1 of 1

It is certified that error appears in the above-identified patent and that said Letters Patent is hereby corrected as shown below:

In the Specification

In Column 10, Line 65, delete "driving the self-luminescent device 2 to emit, light." and insert --driving the self-luminescent device 2 to emit light.--

In the Claims

In Claim 18, in Column 17, Line 6, delete "includes a driving thin film transistor, a first switching thin film transistor, a capacitor, and a self-luminescent" and insert --includes a driving thin film transistor, a first switching thin film transistor, a capacitor and a self-luminescent--

Signed and Sealed this  
Third Day of October, 2023

Katherine Kelly Vidal  
*Director of the United States Patent and Trademark Office*